(12) United States Patent
Haeberle et al.

(10) Patent No.: US 9,719,804 B2
(45) Date of Patent: Aug. 1, 2017

(54) POSITION SENSOR

(71) Applicant: International Business Machines Corporation, Armonk, NY (US)

(72) Inventors: Walter E. M. Haeberle, Waedenswil (CH); Angeliki Pantazi, Thalwil (CH); Abu Sebastian, Adliswil (CH); Tomas Tuma, Adliswil (CH)

(73) Assignee: International Business Machines Corporation, Armonk, NY (US)

(*) Notice: Subject to any disclaimer, the term of this patent is extended or adjusted under 35 U.S.C. 154(b) by 142 days.

(21) Appl. No.: 14/647,132

(22) PCT Filed: Nov. 8, 2013

(86) PCT No.: PCT/IB2013/060002
§ 371 (c)(1),
(2) Date: May 26, 2015

(87) PCT Pub. No.: WO2014/083460
PCT Pub. Date: Jun. 5, 2014

(65) Prior Publication Data
US 2015/0300840 A1    Oct. 22, 2015

(30) Foreign Application Priority Data

Nov. 29, 2012   (GB) .................................. 1221500.0

(51) Int. Cl.
*G01B 7/14*   (2006.01)
*G01D 5/16*   (2006.01)
(Continued)

(52) U.S. Cl.
CPC ............... *G01D 5/16* (2013.01); *G01D 5/145* (2013.01); *G01R 33/09* (2013.01)

(58) Field of Classification Search
CPC .. G01R 33/09; G01R 33/0206; G01R 33/028; G01R 33/038; G01R 33/121;
(Continued)

(56) References Cited

U.S. PATENT DOCUMENTS 4,949,039 A   8/1990   Grunberg
4,992,733 A   2/1991   Griebeler
(Continued)

FOREIGN PATENT DOCUMENTS

EP        283687 B1    11/1991
EP        680008 A1    11/1995
(Continued)

OTHER PUBLICATIONS

Bratland et al., "Linear Position Sensing Using Magnetoresistive Sensors", pp. 1-6, noted in search dated Jun. 29, 2012, <http://www51.honeywell.com/aero/common/documents/Linear_Position_Sensing_Using_Magnetoresistive_Sensors.pdf>.
(Continued)

*Primary Examiner* — Patrick Assouad
*Assistant Examiner* — Demetrius Pretlow
(74) *Attorney, Agent, or Firm* — Steven F. McDaniel

(57) ABSTRACT

A position sensor comprises a magneto-resistive element. The magneto-resistive element comprises a stack of layers including at least a conductive layer in between two magnetic layers. The layers have a longitudinal extension along a longitudinal axis and a lateral extension along a transverse axis. A magnet is provided comprising a magnetic dipole with a dipole axis orthogonal to a plane defined by the longitudinal axis and the transverse axis. The electrical resistance of the conductive layer depends on a position of the magnet along the longitudinal axis. The position sensor provides for nano-scale sensing.

18 Claims, 6 Drawing Sheets

(51) Int. Cl.
*G01R 33/09* (2006.01)
*G01D 5/14* (2006.01)

(58) Field of Classification Search
CPC ........ G01R 33/1215; G11B 2005/3996; G11B 2005/0016; Y10T 428/11075; Y10T 428/1107; B64G 1/366
USPC .............................. 324/207.21, 252, 207.12
See application file for complete search history.

(56) References Cited

U.S. PATENT DOCUMENTS

| | | | |
|---|---|---|---|
| 5,861,747 | A | 1/1999 | Kubinski |
| 5,886,520 | A | 3/1999 | Takeda |
| 6,150,808 | A * | 11/2000 | Yagyu .................. H03K 17/97 324/207.21 |
| 6,940,277 | B2 | 9/2005 | Fries |
| 7,891,102 | B2 | 2/2011 | Peczalski |
| 8,026,715 | B2 | 9/2011 | Pozidis et al. |
| 2006/0261802 | A1* | 11/2006 | Oohashi ................ G06F 3/0338 324/207.21 |
| 2006/0262458 | A1* | 11/2006 | Carey .................. G01R 33/093 360/324.2 |
| 2007/0180911 | A1* | 8/2007 | Shoji .................. G01P 15/105 73/514.31 |
| 2008/0284420 | A1 | 11/2008 | Takeya et al. |
| 2009/0251134 | A1 | 10/2009 | Uenoyama |
| 2009/0295381 | A1* | 12/2009 | Theuss ............... G01R 33/0005 324/252 |
| 2010/0085041 | A1 | 4/2010 | Pozidis et al. |
| 2011/0221435 | A1* | 9/2011 | Ide ..................... G01R 15/205 324/252 |

FOREIGN PATENT DOCUMENTS

| | | |
|---|---|---|
| GB | 2508375 A | 6/2014 |
| JP | 2008286588 A | 11/2008 |
| JP | 2011038919 A | 2/2011 |
| WO | 2008156099 A1 | 12/2008 |
| WO | 2009048018 A1 | 4/2009 |
| WO | 2012011918 A1 | 1/2012 |
| WO | 2014083460 A1 | 6/2014 |

OTHER PUBLICATIONS

Burton, John D., "Magnetoresistive phenomena in nanoscale magnetic systems", Jan. 1, 2008, ETD collection for University of Nebraska—Lincoln, Paper AAI3297588, p. 1, <http://digitalcommons.unl.edu/dissertations/AAI3297588/>.

Daughton, Jim, "Spin-Dependent Sensors", © 2003 IEEE, Proceedings of the IEEE, vol. 91, No. 5, May 2003, pp. 681-686.

Kartik et al., "High-bandwidth nanopositioner with magnetoresistance based position sensing", Mechatronics, vol. 22, Issue 3, Apr. 2012, p. 1, <http://www.sciencedirect.com/science/article/pii/S0957415811001176>.

Parkin et al., "Magnetically Engineered Spintronic Sensors and Memory", © 2003 IEEE, Proceedings of the IEEE, Vo. 91, No. 5, May 2003, pp. 661-680.

Wood et al., "Submicron giant magnetoresistive sensors for biological applications", Available online Dec. 8, 2004, © 2004 Elsevier B.V., doi: 10.1016/j.sna.2004.10.035, pp. 1-6.

"International Search Report and the Written Opinion", International Application No. PCT/IB2013/060002, International filing date Aug. 11, 2013, pp. 1-10.

"Patents Act 1977: Search Report under Section 17(5)", Application No. GB1221500.0, filed on Nov. 29, 2012, date of report Feb. 27, 2013, pp. 1-4.

* cited by examiner

POSITION SENSOR

BACKGROUND OF THE INVENTION

The present invention relates to a position sensor and to a method for determining a position of a first object with respect to a second object.

High bandwidth, high resolution nanoscale sensing is a key enabling technology for nanoscale science and engineering. Application areas include life sciences, scanning probe microscopy, semiconductor fabrication and material science. Currently available position sensors based on optics, capacitors or inductive coils, although accurate and fast, do not scale down to micro-scales for use in microstructures or in large-scale point-wise position sensing of macro-structures. Thermo-electric position sensors, on the other hand, scale down to micro-scale, but suffer from low resolution and bandwidth.

A known position sensing concept is based on the property of magneto-resistance (MR). Magneto-resistance is the property an electrical resistance of a conductive layer sandwiched between ferromagnetic layers changes as a function of a magnetic field applied to the layers. A magneto-resistive sensor typically uses this property to sense the magnetic field.

SUMMARY

According to an embodiment of one aspect of the invention, a position sensor is provided comprising a magneto-resistive element comprising a stack of layers which stack of layers includes at least a conductive layer in between two magnetic layers which layers have a longitudinal extension along a longitudinal axis and a lateral extension along a transverse axis. A magnet is provided comprising a magnetic dipole with a dipole axis orthogonal to a plane defined by the longitudinal axis and the transverse axis. An electrical resistance of the magneto-resistive element depends on a position of the magnet along the longitudinal axis.

In embodiments, the position sensor includes a determination unit for determining the position of the magnet along the longitudinal axis relative to the magneto-resistive element based on the electrical resistance of the magneto-resistive element, the magnet is arranged at a distance D>0 μm from the magneto-resistive element in a direction orthogonal to the longitudinal axis and the transverse axis;
a sensor central axis of the magneto-resistive element is defined orthogonal to the plane defined by the longitudinal axis and the transverse axis at a position half of the longitudinal extension of the layers of the stack, and wherein a distance between the dipole axis of the magnet and the sensor central axis of the magneto-resistive element is less than a distance limit;
the magnet is movably mounted in direction of the longitudinal axis with the dipole axis being displaceable along the longitudinal extension of the layers of the stack;
the magnet is movably mounted in direction of the longitudinal axis with the dipole axis being displaceable along the longitudinal extension of the layers of the stack at maximum to the distance limit, and wherein the distance limit is obtained by dividing a maximum strength of a magnetic field of the magnet (2) applied to the magneto-resistive element (1) without saturating the magneto-resistive element (1) by a gradient of the magnetic field of the magnet (2) along the longitudinal axis (X) at a distance D from the magnet (2);
the magnet is arranged to be operated such that a magnetic field portion where magnetizations of opposite directions are present acts on the layers of the stack along the longitudinal axis;
the magnet is a permanent magnet with a width along the longitudinal axis;
the width of the magnet is less than twenty times the longitudinal extension of the layers of the stack;
the width of the magnet is less than ten times the longitudinal extension of the layers of the stack;
the width of the magnet is equal to the longitudinal extension of the layers of the stack;
the width of the magnet is more than the longitudinal extension of the layers of the stack;
a height of the magnet in a direction orthogonal to the plane defined by the longitudinal axis and the transverse axis is at least 80% of the width of the magnet;
the height of the magnet is at least 90% of the width of the magnet;
the height of the magnet is equal to the width of the magnet;
the height of the magnet is more than the width of the magnet;
the distance between the magnet and the magneto-resistive element is between 20% and 40% of the width of the magnet;
the distance is between 25% and 35% of the width of the magnet;
the distance is equal to a third of the width of the magnet;
the width of the magnet is between 300 μm and 1500 μm;
the distance between the magnet and the magneto-resistive element is between 60 μm and 600 μm;
the longitudinal extension of the layers of the stack is between 10 μm and 150 μm.
the magneto-resistive element is a giant-magneto-resistive element;

According to an embodiment of another aspect of the present invention, a method is provided for determining a position of a first object with respect to a second object by means of a position sensor according to any one of the preceding embodiments. The magnet is attached to the first object. The magneto-resistive element is attached to the second object such that the dipole axis of the magnetic dipole of the magnet is aligned orthogonal to the plane defined by the longitudinal axis and the transverse axis of the layers of the stack of the magneto-resistive element. An electrical resistance of the magneto-resistive element is determined.

In a preferred embodiment of the method, the magnet is operated such that a magnetic field portion where magnetizations of opposite directions are present acts on the layers of the stack along the longitudinal axis.

In another preferred embodiment of the method, the magnet is moved in direction of the longitudinal axis with the dipole axis being displaceable along the longitudinal extension of the layers of the stack at maximum to a distance limit, wherein the distance limit is obtained by dividing a maximum strength of a magnetic field of the magnet applied to the magneto-resistive element without saturating the magneto-resistive element by a gradient of the magnetic field of the magnet along the longitudinal axis at a distance D from the magnet.

It is understood that method steps may be executed in a different order than listed in a method claim where feasible. Such different order shall also be included in the scope of such claim as is the order of steps as presently listed. Embodiments described in relation to the aspect of the position sensor shall also be considered as embodiments disclosed in connection with any of the other categories such as the method.

DETAILED DESCRIPTION

Figure 1:
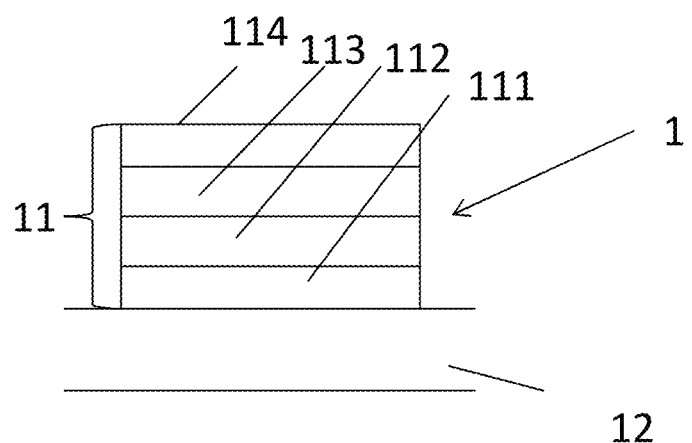
FIG. 1 is a schematic cut of a magneto-resistive element according to an embodiment of the present invention.

Hereinafter, the present invention will be described in various embodiments. It should be noted, however, that the following embodiments are not intended to limit the scope of the appended claims, and that not all the combinations of features described in the embodiments are necessarily required by the present invention.

As an introduction to the following description, it is first pointed at a general aspect of the invention concerning a position sensor based on the magneto-resistive effect.

A magneto-resistive position sensor comprises a magneto-resistive element comprising a stack of layers which stack of layers includes at least a conductive layer in between two magnetic layers, including in between two ferromagnetic layers. Specifically, the magneto-resistive element is a giant magneto-resistive element based on the underlying effect wherein in a layer stack comprising a non-magnetic conductive layer sandwiched between two ferromagnetic layers a change in the electrical resistance can be observed subject to a magnetization orientation in the ferromagnetic layers. In the absence of an external magnetic field, the magnetization orientation the corresponding ferromagnetic layers is antiparallel. By means of applying an external magnetic field to at least one of the ferromagnetic layers the subject magnetization orientation is changed which in turn leads to the magnetization orientation in the two ferromagnetic layers becomes parallel which in turn causes the electrical resistance of the layer stack to change. The electrical resistance of the layer stack is also denoted as electrical resistance of the magneto-resistive element. The change in the electrical resistance may be monitored and taken as a measure for the presence of an external magnetic field applied. When such external magnetic field is generated by a magnet attached to an object, a position of such object may be determined with respect to the magneto-resistive element. Specifically, a significant change of the electrical resistance in the conductive layer can be observed when the magnetization orientation of the ferromagnetic layers is changed between a parallel alignment to an antiparallel alignment or vice versa. In a parallel alignment of the magnetization orientation of the ferromagnetic layers the electrical resistance in the conductive layer is rather low while in an antiparallel alignment of the magnetization orientation of the ferromagnetic layers the electrical resistance in the conductive layer is rather high. The change in conductivity is based on spin-dependent interfacial electron scattering. Electrons passing the magneto-resistive element may show a short mean free path at antiparallel magnetization orientation in the ferromagnetic layers owed to an increased spin dependent electron scattering at the interfaces between the conductive layer and the ferromagnetic layers while electrons may show a longer mean free main path owed to a less spin dependent interfacial electron scattering when the ferromagnetic layers show a parallel magnetization orientation.

The magneto-resistive element hence comprises a stack of layers which at least includes one conductive layer in between two ferromagnetic layers, but which stack of layers may include multiple conductive layers sandwiched between adjacent ferromagnetic layers, wherein an overall electrical resistance of the stack of layers may finally be measured and allow for a determination of the position of the field generating magnet relative to the magneto-resistive element. An external magnetic field applied may cause the magnetization orientation in these ferromagnetic layers to switch from an antiparallel alignment to a parallel alignment or vice versa. Generally, and specifically for the present embodiments of the invention, the magnetization orientation of both ferromagnetic layers may be floating or, alternatively, the magnetization orientation of one of the ferromagnetic layers may be pinned such that its magnetization orientation may not change even under the application of an external magnetic field. The external magnetic field may then only act on the other ferromagnetic layer and cause its magnetization orientation to change subject to a position the magnet takes.

In the context of the present embodiments of the invention, the following geometrical definitions are used: The layers of the layer stack may have a longitudinal extension along a longitudinal axis and a lateral extension along a transverse axis. Accordingly, a height of the stack extends orthogonal to a plane defined by the longitudinal and the transverse axis which direction is in parallel to a vertical axis orthogonal to the longitudinal and the transverse axis. A sensor central axis of the magneto-resistive element is defined as an axis orthogonal to the plane defined by the longitudinal axis and the transverse axis, i.e. in parallel to the vertical axis, and at half of the longitudinal extension of the layers. It is further assumed that a magnet and/or an object comprising the magnet is at least movable along the longitudinal axis, which means that the magnet is movable along the longitudinal extension of the layers of the layer stack. The magnet may be arranged at a distance D>0 from the magneto-resistive element such that the magnet and an upper surface of the magneto-resistive element are spaced apart along the vertical axis by the distance D. Moreover, the magnet is assumed to provide a magnetic dipole including a North (N) and a South (S) pole. A dipole axis of the magnetic dipole is assumed to be a straight connection between the N pole and the S pole. A distance between the dipole axis of the magnet and the sensor central axis of the magneto-resistive element is assumed to be the distance between these axis when being located at the same transverse position along the transverse axis.

In conventional magneto-resistive position sensing concepts a dipole axis of the magnetic dipole of the magnet is aligned in parallel to a longitudinal extension of the layers of the layer stack contributing to the magneto-resistive element. Given that a gradient of the magnetic field is responsible for generating a change in the magnetization orientation of the one or more ferromagnetic layers, it was observed that in the conventional concept the gradient of the magnetic field along the longitudinal extension of the layers of the stack is rather low. The gradient is defined as a change in magnetic flux at a subject location. However, the higher the gradient of the magnetic field is along the longitudinal extension of the layers of the stack the higher the sensitivity/resolution of the sensing scheme is given that only a small variation of the position of the magnet may cause an impact on the magnetization orientation of the ferromagnetic layers due to such small variation in position still leads to a substantial change in magnetic flux owed to the high gradient.

In addition, it was observed that for typical magnet geometries such as rectangular permanent magnets, an absolute strength of the magnetic field at a given distance from the magnet increases with the gradient. Because there is an upper bound on the strength of the magnetic field after which the magneto-resistive element saturates, the gradient of the magnetic field that can effectively be used for sensing is limited.

According to an embodiment of the present invention, the dipole axis of the magnet is aligned orthogonal to a plane defined by the longitudinal axis and the transverse axis. Hence, the dipole axis is also orthogonal to a sensing direction of the magneto-resistive element which sensing direction is defined by the longitudinal extension of the layers of the stack in direction of the longitudinal axis. Orthogonal in this context shall include tolerances of +/−20° degrees, i.e. the dipole axis is supposed to be arranged with a range of 70° to 110° degrees with respect to the plane defined by the longitudinal axis and the transverse axis.

In the conventional concept with the magnetic dipole axis being aligned in parallel to the sensing direction, only a portion of the magnetic field generated by the magnet acts on the magneto-resistive element with such portion of the magnetic field showing only a single orientation in sensing direction across the longitudinal extension of the layer stack. Instead, in the present arrangement with the dipole axis being aligned orthogonal to the plane defined by the longitudinal axis and the transverse axis, the magnetic field generated by the magnet acts on the magneto-resistive element with a portion containing magnetizations in opposite directions in the sensing direction.

Hence, a novel arrangement and method for magneto-resistance-based position sensing is introduced. By means of arranging the magnet such that its dipole axis is orthogonal to the sensing direction, a strong magnetic gradient affects the stack of layers. In particular, when the generated magnetic field acts on the layer stack with opposite magnetization directions along the longitudinal axis, the above saturation effect can be overcome given that the magnetic field portion with the magnetizations in opposite directions results in a low magnetic flux density that acts on the layer stack and causes that the magneto-resistive element can still be operated in a sensing range with high magnetic field gradients. The sensing range is determined by the longitudinal extension of the layers of the stack, the saturation effect and the gradient of the magnetic field. As a result, the present position sensor and the corresponding method for determining a position qualify by high bandwidth, high sensitivity and low noise and as such can be used in multiple applications in micro- and nanotechnology.

In one embodiment of the present invention, the magnet is a permanent magnet of a size comparable to the size of the stack of layers. This includes a width of the magnet along the longitudinal axis comparable to the longitudinal extension of the layers of the stack. In this context, comparability may include a width of the magnet not more than ten times the longitudinal extension of the layers of the stack, and preferably not less than half of the longitudinal extension of the layers of the stack. By means of applying such dimensions, a magnetic field with magnetization of opposite directions may act on the layers of the stack, and as a result affect the overall electrical resistance of the layers of the stack. In a very preferred embodiment, the magnet is of rectangular shape in a plane defined by the longitudinal axis and the vertical axis, and in another very preferred embodiment is of cubic shape in its three dimensions.

According to another embodiment of the present invention, the magnet is positioned in proximity to the magneto-resistive element such that the magnetic field portion affecting the magneto-resistive element is such that it has different directions of magnetization which results in low magnetic field strength and high magnetic field gradient. Of all vertical positions of the magnet that satisfy this condition, a position is selected which provides a large gradient of the applied magnetic field in the sensing range while at the same time provides good linearity properties of the gradient over the sensing range. Owing to the magnetic field transition between the magnetic field portions of opposite direction, ultra-high sensitivity with respect to the motion of the magnet relative to the magneto-resistive element can be achieved without saturating the magneto-resistive element.

In the figures, same or similar elements are denoted by the same reference designators.

FIG. 1 illustrates a schematic side cut of a magneto-resistive element 1 according to an embodiment of the present invention. The magneto-resistive element 1 is an element specifically underlying the giant magneto-resistivity phenomenon, wherein in thin magnetic multilayers with one or more conductive layers in between spin coupling occurs. The present magneto-resistive element 1 comprises a layer stack 11 arranged on a substrate 12 which layer stack 11 includes at least a first ferromagnetic layer 11, a conductive and non-magnetic layer 112, a second ferromagnetic layer 113, and an antiferromagnetic cover layer 114. Magnetic moments of the ferromagnetic layers 111 and 113 are naturally aligned antiparallel with respect to each other when no external magnetic field is applied. In case an external magnetic field of sufficient strength is applied, magnetic moments become parallel in the ferromagnetic layers 111 and 113, i.e. the magnetization orientations in the ferromagnetic layers 111 and 113 are aligned in parallel. An antiparallel magnetization orientation in the ferromagnetic layers 111 and 113 result in a rather low mean free path of electrons passing the layer stack 11 leading to a rather high electrical resistance in the layer stack 11. On the other hand, a parallel magnetization orientation in the ferromagnetic layers 111 and 113 result in a rather high mean free path of electrons passing the layer stack 11 leading to a rather low electrical resistance in the layer stack 11. This effect is based on the dependence of electron scattering on the spin orientation at the interfaces of the layers 111, 112 and 113.

When the magneto-resistive element is used for sensing the position of an object a magnet for generating the magnetic field acting on the magneto-resistive element may be attached to such object. A change in a position of the object then is detected by detecting a change in an electrical resistance measure of the layer stack, such as the electrical resistance itself or the conductivity.

Figure 2:
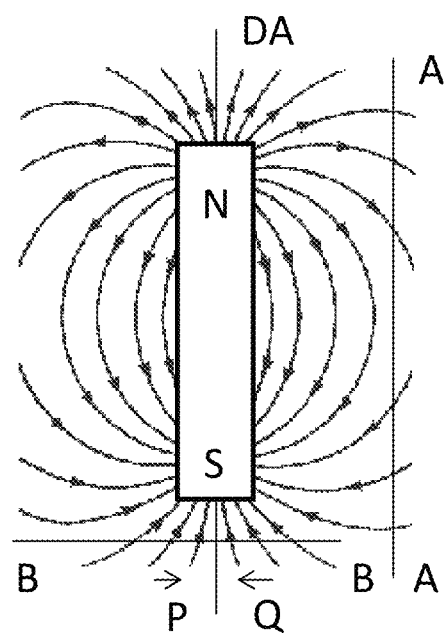
FIG. 2 is a diagram of magnetic field lines of a magnetic dipole generated by a magnet according to an embodiment of the present invention.

FIG. 2 illustrates a diagram of magnetic field lines of an ideal magnetic dipole (N/S) generated by a rectangular magnet as used in a position sensor according to an embodiment of the present invention. While in conventional position sensors the magnet is aligned with its dipole axis DA in parallel to a sensing direction of the magneto-resistive element coinciding with the longitudinal extension of the layers and denoted by line A-A, in the present embodiment of the invention the magnet is aligned with its dipole axis DA orthogonal to the sensing direction of the magneto-resistive element denoted by line B-B.

At the magnetic poles, the strength of the magnetic field generally is the highest. However, as can be derived from the diagram in FIG. 2, the magnetic field lines in the single dimension on line B-B which represents the preferred sensing direction and simultaneously represents the longitudinal extension of the layers of the stack go through zero magnitude because magnetic field portions projected on the sensing direction B-B change direction. Therefore, the closer the magnet is arranged with respect to the magneto-resistive element, the higher the gradient of the magnetic field becomes along the longitudinal extension of the stack of layers. However, as will be shown below, approaching the magneto-resistive element too close by the magnet can make the gradient suffer from non-linearity.

In contrast, in the conventional parallel arrangement of the sensing direction A-A and the dipole axis DA, the magnetic field gradient in sensing direction is rather low as is the strength of the magnetic field. When further approaching the dipole axis DA by the magneto-resistive element extending on line A-A, the gradient improves but so does the magnetic strength which may lead to saturation. In any case, the conventional sensing concept only makes use of a portion of the magnetic field with uniform direction in the sensing direction. In FIG. 2 this portion is represented by the magnetic field lines right to the dipole axis DA. In contrast, the present embodiments make use of a portion of magnetic field lines specifically containing a part to the right of the dipole axis DA and a part to the left of the dipole axis DA according to FIG. 2. For this reason, both a high gradient and a low strength of the magnetic field can be achieved at the same time. The low strength of the magnetic field is owed to the fact that the magnetic field lines go through zero magnitude because the magnetic field in the subject portion when projected to the sensing direction changes direction, see arrows P and Q.

The magnet used may include a permanent magnet or an electromagnetic magnet. In some embodiments, miniature ultra-thin magnetic dipoles may be used for enabling the stack of layers being exposed to magnetic fields with a very high gradient. A position sensing resolution of less than <200 pm over 100 kHz may be achieved.

Figure 3:
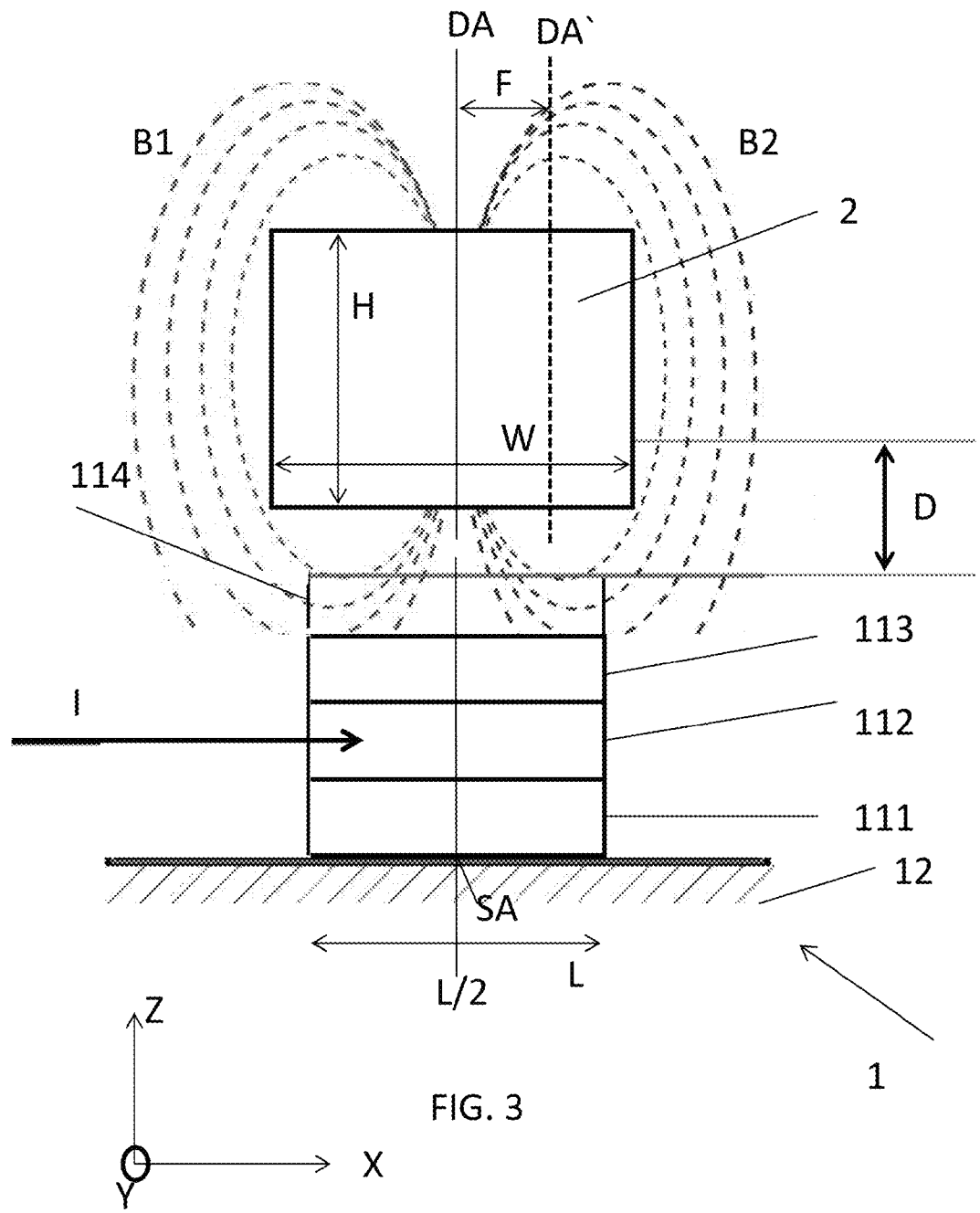
FIG. 3 is a schematic cut of a position sensor according to an embodiment of the present invention.

FIG. 3 illustrates a schematic side cut of a position sensor according to an embodiment of the present invention. The layers 111, 112, 113 and 114 correspond to the layers of the magneto-resistive element 1 of FIG. 1. The layers of the layer stack show a longitudinal extension L along the longitudinal axis X. The layers also extend along the transverse axis Y into the plane of projection. A current I may be applied to the layer stack during position sensing. The layers of the stacks are arranged vertically, i.e. along vertical axis Z on top of each other. At a distance D from a surface of the magneto-resistive element 1 a permanent magnet 2 is arranged. The magnet 2 is of rectangular shape with a width W along the longitudinal axis X, a depth not visible along the transverse axis y, and a height H along the vertical axis Z. The dipole axis of the magnet 2 is referred to by DA again. The width W of the magnet is larger than the longitudinal extension L of the layer stack. The dipole axis DA of the magnet 2 coincides with the sensor central axis SA of the magneto-resistive element 1. This means, the magnet 2 is centered above the magneto-resistive element 1. The magnet 2 provides a magnetic field illustrated in dashed lines which virtually may be separated into a first part B1 and a second part B2. As can be derived from FIG. 3, magnetic field lines from both parts B1 and B2 affect the layer stack and as such impact the magnetization orientation of the ferromagnetic layers 113 and/or 111. Given that the different parts B1 and B2 result in magnetizations of opposite direction along the longitudinal extension when projected to this dimension, the combined magnetic field portion B1 and B2 generated by the magnet 2 affects the magnetic orientation of the ferromagnetic layers 111, 113, by this cancelling out to some extent the magnetic strength acting on the magneto-resistive element 1. At the same time, both of these two portions, see P and Q in FIG. 2, qualify by a high gradient which is desired for achieving a high resolution because yet small changes in the position of the corresponding magnet 2 may cause a realignment of the magnetic spin in the ferromagnetic layers 111, 113 which in turn may affect the conductivity of the layer stack.

In FIG. 3, another scenario is indicated by a dotted dipole axis DA when the magnet 2 is offset from the sensor center axis SA in direction of the longitudinal axis X by a distance F. This may, for example, be the case when a first object the magnet 2 is attached to is moved with respect to the second object the magneto-resistive element 1 is attached to. The distance F may be limited in terms of sensitivity. This means that beyond the limit which is also denoted as a distance limit, the position sensor operate less effectively. This means, that preferably the magnet 2 and the magneto-resistive element 1 may either only be allowed to be offset from each other at a distance+/− the distance limit from the middle L/2 of the magneto-resistive element 1. Such range may be denoted as preferred sensing range L/2+/− Fmax with Fmax being the distance limit in this embodiment. In another embodiment, a movement of the magnet 2 only within the preferred distance may be achieved by stoppers that stop a displacement of the magnet 2 outside the preferred sensing range.

When the dipole axis DA and the sensor center axis SA are aligned, i.e. the magnet center is aligned with the center of the layers stack in longitudinal direction the electrical resistance of the magneto-resistive element 1 is at a maximum. By way of displacing the magnet 2 in the longitudinal direction X to either of the sides, and hence, by increasing the distance F between the dipole axis DA and the sensor center axis SA, the electrical resistance of the magneto-resistive element 1 decreases until the magneto-resistive element 1 saturates. The point where the saturation happens is given by a saturation limit of the magneto-resistive element 1 and a rate of increase of the magnetic field generated by the magnet 2, i.e. the gradient. If the saturation is expressed in Gauss and the gradient is expressed in Gauss/m, then it can be seen that at maximum distance Fmax="saturation/gradient" the sensor will saturate. Hence, for effective sensing, the distance F between the dipole axis DA and the sensor center axis SA preferably is smaller than this limit Fmax.

If the magneto-resistive element 1 is not negligibly small, there may be a region along the layers of the stack where some parts of the magneto-resistive element 1 are already saturated and some not. In this region, the response of the magneto-resistive element 1 might be non-linear. A size of the region depends on the longitudinal extension L and other characteristics of the magneto-resistive element 1 and may typically less than 10% of the preferred sensing range Fmax. However, this may in one embodiment this may lead to applying a very preferred sensing range of L/2+/− Fmax2 with Fmax2 being 10% less than Fmax determined by the above formula in order not to hit this region.

Figure 4:
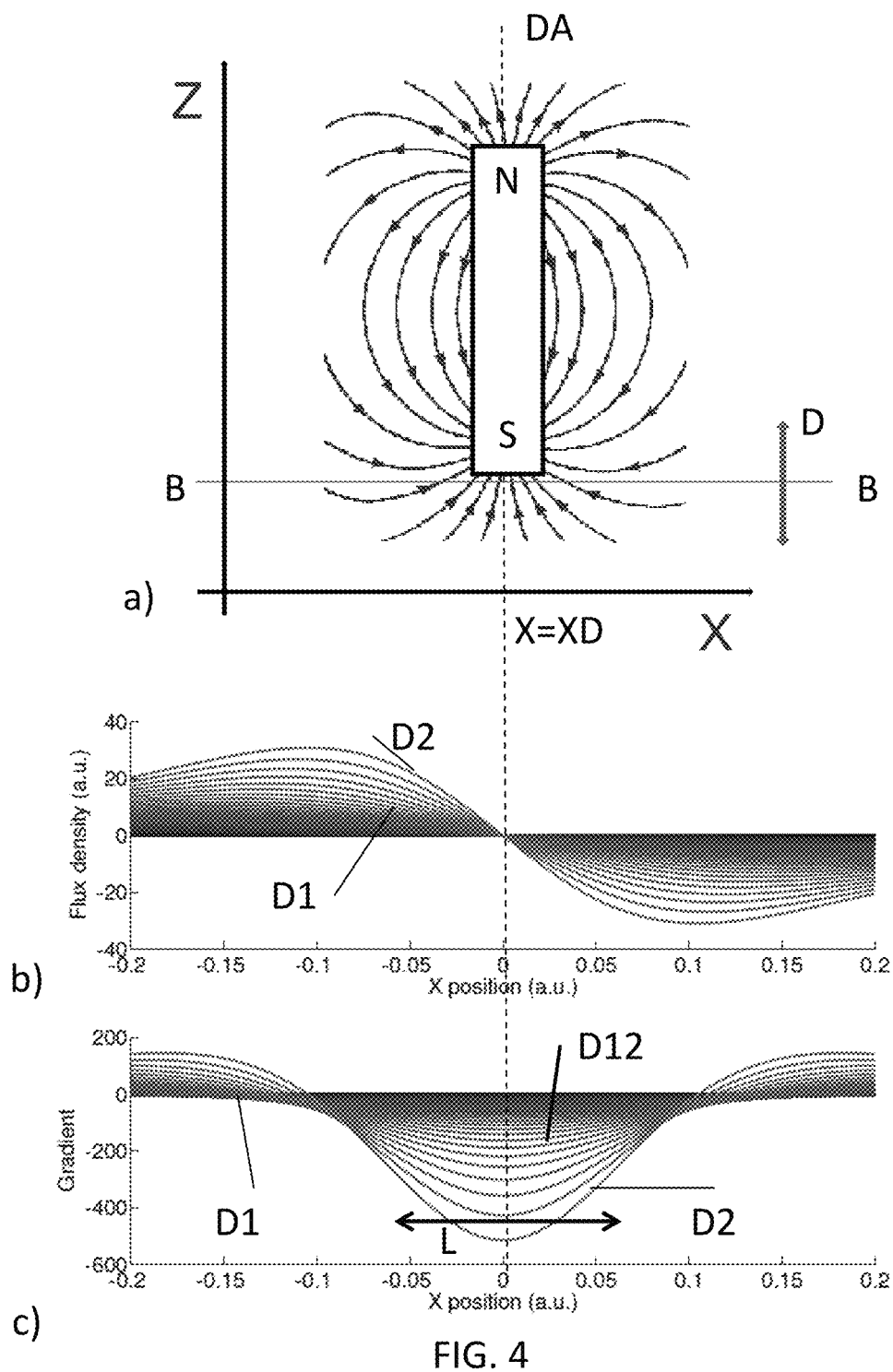
FIG. 4 is a set of diagrams illustrating an impact of a magnetic field on a magneto-resistive element according to an embodiment of the present invention.

FIG. 4 shows diagrams illustrating an impact of a magnetic field on a magneto-resistive element according to an embodiment of the present invention. In diagram 4a) the magnetic field lines of a magnetic dipole are shown according to FIG. 2 wherein again the longitudinal extension of the magneto-resistive element is indicated by line B-B which magneto-resistive element may be positioned at various distances D from the magnet as is indicated by the double arrow. The magnetic field lines are shown in a plane defined by the longitudinal axis X and the vertical axis Z. In diagram 4b), a corresponding flux density—also denoted as strength of the magnetic field—is shown over the longitudinal axis X, and specifically is shown for different distances D between the magnet and the magneto-resistive element. It can be derived from diagram 4b) that the magnetic flux is zero at the location of the dipole axis X=XD while it is non-zero for X outside XD. In diagram 4b), the corresponding gradient of the magnetic field is shown over the longitudinal axis X, and specifically is shown for different distances D between the magnet and the magneto-resistive element with D1>D2. It can be derived from diagram 4c), that at the location of the dipole axis X=XD, the gradient has a maximum value while outside the dipole axis X=XD the gradient is lower in its absolute value. It further can be derived from diagram 4b) that the bigger the distance D is the lower the magnetic flux density is while the closer the magneto-resistive element is arranged with respect to the magnet the higher the magnetic flux density is. On the other hand, it can be derived from diagram 4c) that the closer the magneto-resistive element gets to the magnet, the higher the maximum gradient value becomes at X=XD.

In terms of resolution a high gradient and a low flux density is desired at the same time. Diagram 4c) in addition shows that a determination of the distance D may also take into account the linearity of the gradient: It is assumed, for example, that the longitudinal extension L of the layers of the stack represents the sensing range as is shown in diagram 4c). This sensing range can be impacted by the magnetic field. Given that the gradient is key to the resolution it may be desired at the same time to provide a position sensor sensing with a rather linear property over the sensing range. However, from diagram 4c) it can be derived that the closer the magneto-resistive element is arranged with respect to the magnet, the higher the maximum gradient becomes, but after a point the the gradient becomes less linear across the sensing range. Hence, it may be preferred to select a distance D12 that at the same time provides a sufficient gradient and a sufficient linearity in the sensing range.

Figure 5:
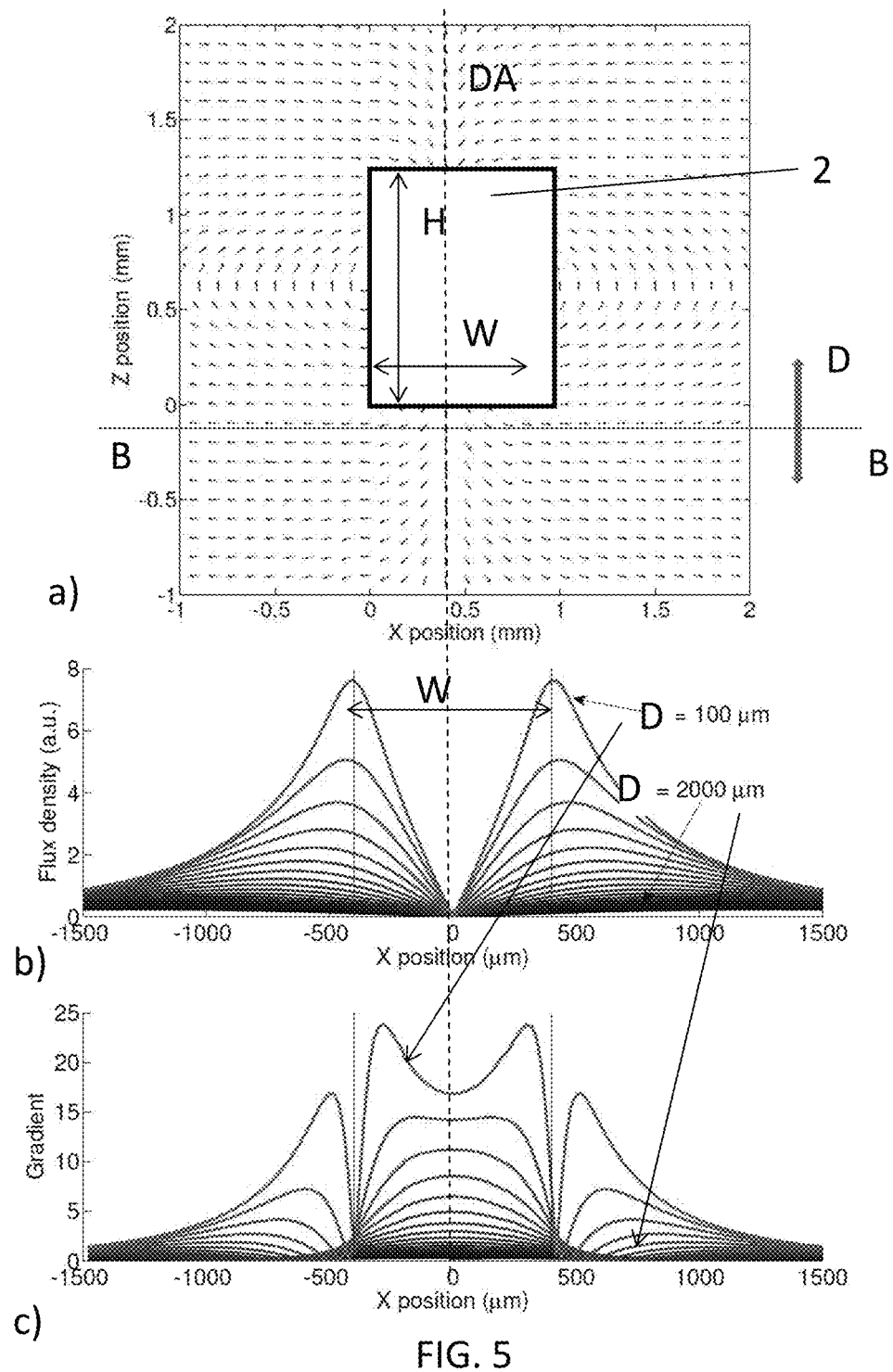
FIG. 5 is a set of diagrams illustrating an impact of a magnetic field generated by a rectangular magnet on a magneto-resistive element according to an embodiment of the present invention.

FIG. 5 illustrates an impact of a magnetic field generated by a rectangular magnet 2 on a magneto-resistive element according to an embodiment of the present invention. The magnet 2 has a width W and a height H and a dipole axis DA. The resulting magnetic field lines are illustrated as small arrows in the rectangle around the magnet 2. Again, diagrams 5b) and 5c) illustrate the resulting flux density and gradient along the longitudinal axis X for various distances D between the magnet 2 and the magneto-resistive element on line B-B. Again, for the desired sensing range a compromise may be achieved between a highest possible gradient and the gradients linearity across the measurement range.

Figure 6:
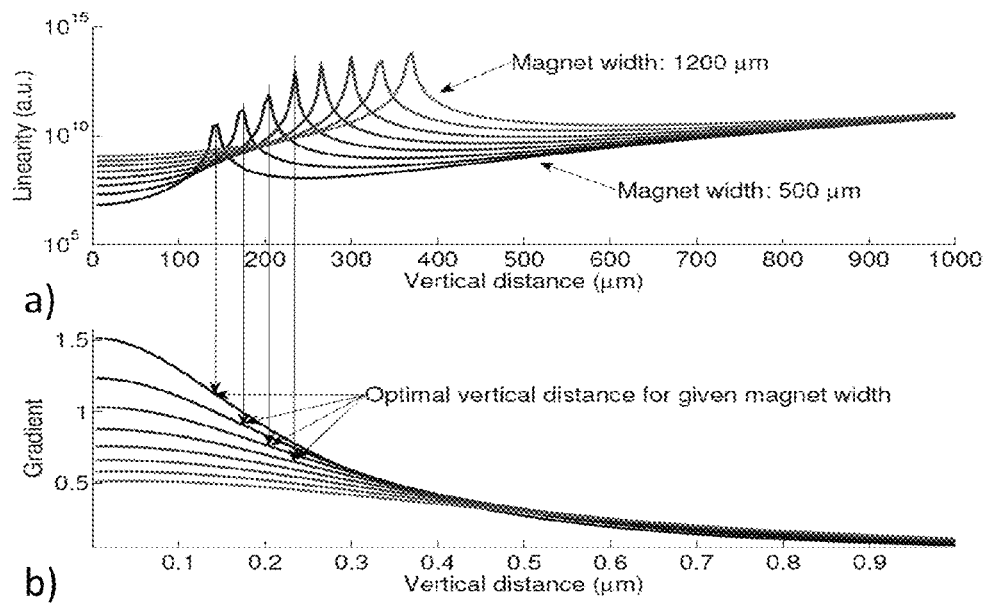
FIG. 6 is a set of diagrams illustrating dependencies between gradient, signal linearity, vertical distance and magnet width in a position sensor according to an embodiment of the present invention.

FIG. 6 illustrates in two diagrams dependencies between gradient, signal linearity, vertical distance and magnet width in a position sensor according to an embodiment of the present invention. The setup of FIG. 5 may be the underlying configuration. In diagram 6a) the linearity is depicted in dependence from the vertical distance D for various magnet widths W while in diagram 6b) the gradient is depicted in dependence from the vertical distance D for various magnet widths W. Again, it can be derived from diagram 6b) that the smaller the distance D is the higher is the gradient. At the same time, the gradient may be improved by reducing the width W of the magnet, i.e. the smaller the width W of the magnet becomes the higher the gradient becomes. Diagram 6a) illustrates that the wider the magnet width W is the better the linearity is over a given sensing range. This results in that, for example, for a given vertical distance D and a given sensing range, a way to improve the gradient is to thinner the width W of the magnet which is, however, limited by the linearity of the magnetic field which decreases with decreasing width of the magnet. For rectangular magnets of a fixed width, a particular vertical distance D might result in the best linearity.

Figure 7:
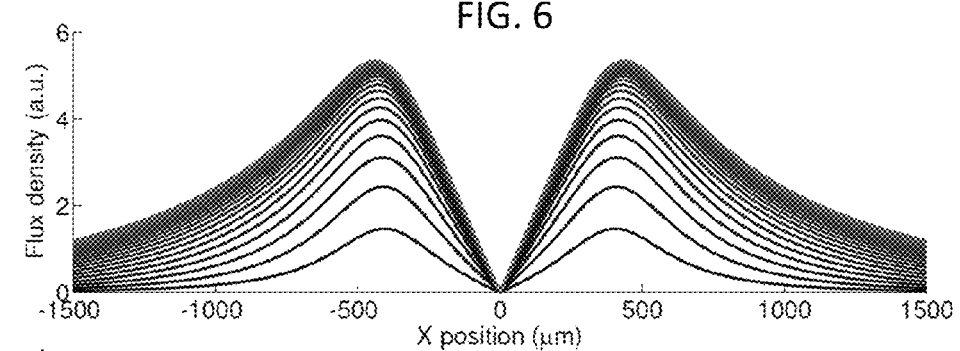
FIG. 7 is a set of diagrams illustrating dependencies between gradient, signal linearity, magnet height and magnet width in a position sensor according to an embodiment of the present invention.
Figure 7:
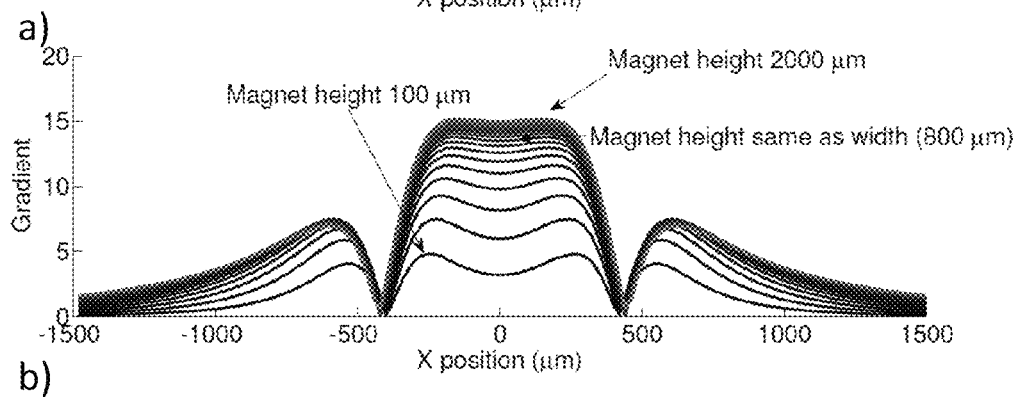

FIG. 7 illustrating in two diagrams dependencies between gradient, signal linearity, magnet height and magnet width in a position sensor according to an embodiment of the present invention. Again, the configuration of FIG. 5 may be the underlying position sensor for the data of FIG. 7. In diagram 7a) the flux density along the longitudinal axis X is shown for various heights H of the magnet. Diagram 7b) illustrates the gradient along the longitudinal axis X for various heights H of the magnet. Hence, FIG. 7 illustrates the role of the aspect ratio H/W of the magnet. It can be derived, that low heights H compared to the width W of the magnet result in rather non-linear gradients. However, as long as the height H of the magnet is about at least 80% of the width W of the magnet, the impact of the height H on the linearity of the gradient becomes rather low meaning that for all heights H above, and specifically for all heights above the width of the magnet, the linearity of the gradient is no longer affected to the worse. Hence, it is preferred that the magnet is at least 80% high as wide. Preferably, the height of the magnet is at least as tall as its width W.

Design rules for permanent magnets used in embodiments of the position sensor may include the following:

For increasing the sensitivity of a position sensor of the present set-up, it is preferred to reduce the width W of the magnet and/or reduced the distance D between the magnet and the magneto-resistive element up to an optimal point where the linearity of the gradient still is sufficient, and make the magnet at least as high as wide. In other words, a given width of a rectangular magnet determines an optimal vertical distance from the sensor. The vertical distance should be chosen such that the gradient linearity is optimized over the sensing range.

On the other hand, in case the measurement range of a position sensor is too small, then the width of the magnet preferably is increased and/or the distance from the magneto-resistive element is increased.

To reach really high sensitivities, the magnet may be shrunk down to the dimensions of the sensor.

On the other hand, there is no upper bound on the magnet width; the scheme works with any magnet width and a corresponding vertical distance from the magneto-resistive element. Wider magnets may be arranged at a bigger distance from the sensor to magneto-resistive element for providing a sufficient gradient linearity which in turn may cause the gradient to decrease.

A strength of the magnet (i.e. the type of magnetic material used, or the current through the coil in case of an electromagnet) also may impact the design of the position sensor.

Figure 8:
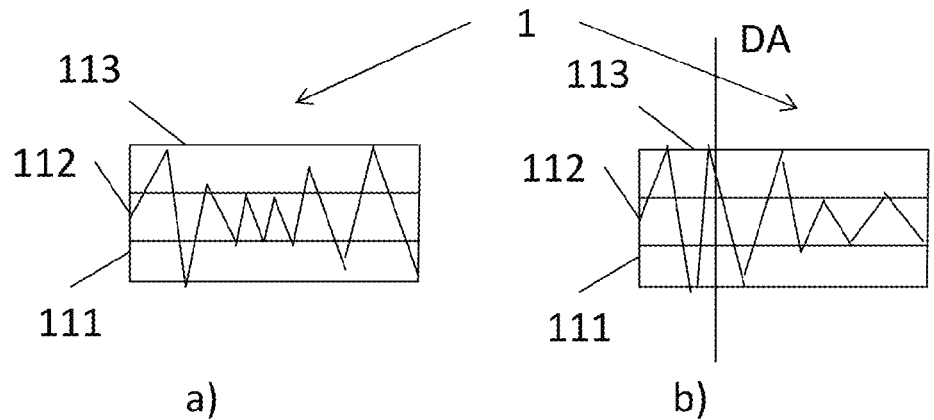
FIG. 8 is a set of diagrams illustrating an anticipated underlying spin effect in a position sensor according to an embodiment of the present invention.

FIG. 8 illustrates an anticipated underlying spin effect in a position sensor according to an embodiment of the present invention. In the diagrams 8a) and 8b), a cut of the corresponding magneto-resistive element 1 is shown again with two ferromagnetic layers 111 and 113 and the conductive layer 112 and with two different mean free paths of electrons depicted. In the middle section of the magneto-resistive element in diagram 8a) the mean free electron path is rather short such that in this section an antiparallel magnetization orientation may be assumed which may be owed to an external magnetic field not affecting this middle section. In the sections to the left and to the right of the middle section, the mean free electron path is rather long indicating a parallel magnetization orientation caused by the impact of an external magnetic field in these sections. Instead, in the diagram 8b), the section to the left may be affected by an external magnetic field resulting in a long mean free electron path while the section to the right does not seem to be affected by the external field resulting in a short mean free electron path. In this example, one may assume that the magnetic dipole axis of the magnet is arranged in a position as depicted in diagram 8b). Generally, it is assumed that in the position sensor of the present embodiments the magneto-resistive element no longer is uniformly magnetized by the external magnetic field, i.e. the ferromagnetic layers 111 and 113 are magnetized non-uniformly in space.

Figure 9:
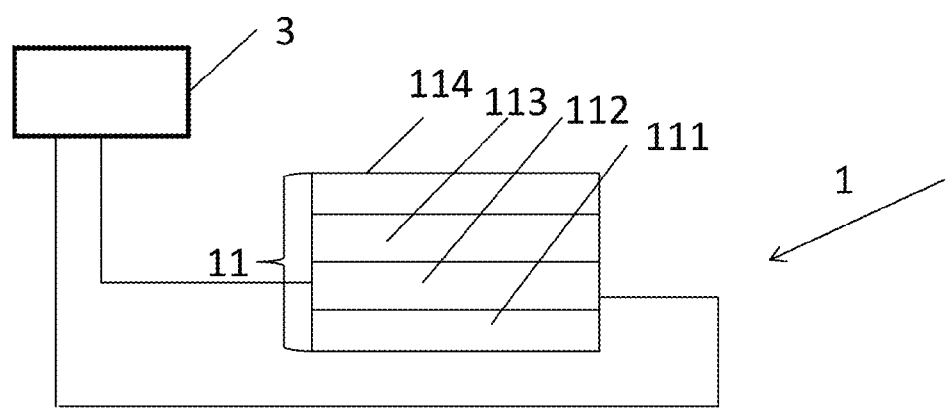
FIG. 9 is a block diagram of a position sensor according to an embodiment of the present invention.

FIG. 9 illustrates a block diagram of a position sensor according to an embodiment of the present invention. In addition to the elements already shown in FIG. 3, a determination unit 3 is shown which on the one hand measures the electrical resistance or conductivity of the layer stack and specifically any changes in these measures, and on the other hand translates the measured results into a position between a first object the magnet is attached to and a second object the magneto-resistive element is attached to.

Embodiments of the present invention may be applicable to position sensing in industry, to lithography, and specifically in connection with semiconductors such as the manufacturing, EDA and testing of semiconducting devices, and specifically of micro- and/or nano-electromechanical devices. Any such position sensor may transmit its result wire bound or wireless to an evaluation unit.

It should be noted that the apparatuses disclosed herein may be integrated with additional circuitry within integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The invention claimed is:

1. An apparatus comprising:
  a magneto-resistive element comprising a stack of layers including at least a conductive layer in between two magnetic layers which layers have a longitudinal extension along a longitudinal axis and a lateral extension along a transverse axis;
  a magnet comprising a magnetic dipole with a dipole axis orthogonal to a plane defined by the longitudinal axis and the transverse axis wherein a height of the magnet is selected to be greater than a span of the magnet along the longitudinal axis;
  at least one stopper configured to limit travel of the magnet to a selected sensing range along the longitudinal axis;
  wherein an electrical resistance of the magneto-resistive element depends on a position of the magnet along the longitudinal axis; and
  wherein at least some portion of the magneto-resistive element experiences anti-parallel magnetization from the magnet over the entire selected sensing range.

2. The apparatus of claim 1, further comprising a determination unit for determining the position of the magnet along the longitudinal axis relative to the magneto-resistive element based on the electrical resistance of the magneto-resistive element.

3. The apparatus of claim 1, wherein the magneto-resistive element is a giant-magneto-resistive element, and wherein the magnet is disposed at a distance D from the magneto-resistive element in a direction orthogonal to the longitudinal axis and the transverse axis.

4. The apparatus of claim 1, wherein a sensor central axis of the magneto-resistive element is defined orthogonal to the plane defined by the longitudinal axis and the transverse axis at a position half of the longitudinal extension of the layers of the stack.

5. The apparatus of claim 1, wherein the selected sensing range is obtained by dividing a maximum strength of a non-saturating applied magnetic field for the magneto-resistive element by a gradient of the magnetic field of the magnet along the longitudinal axis at a distance D from the magnet.

6. The apparatus of claim 1, wherein the magnet is arranged to be operated such that a magnetic field portion with magnetizations of opposite direction acts on the layers of the stack along their longitudinal extension over the entire selected sensing range.

7. The apparatus of claim 1, wherein the magnet is a permanent magnet.

8. The apparatus of claim 7, wherein the distance between the magnet and the magneto-resistive element is between 20% and 40% of the span of the magnet along the longitudinal axis.

9. The apparatus of claim 7, wherein the span of the magnet along the longitudinal axis is between 300 μm and 1500 μm, and wherein the distance between the magnet and the magneto-resistive element is between 60 μm and 600 μm.

10. The apparatus of claim 1, wherein the longitudinal extension of the layers of the stack is between 10 μm and 150 μm.

11. A method comprising:
providing a magneto-resistive element comprising a stack of layers including at least a conductive layer in between two magnetic layers which layers have a longitudinal extension along a longitudinal axis and a lateral extension along a transverse axis;
providing a magnet comprising a magnetic dipole with a dipole axis orthogonal to a plane defined by the longitudinal axis and the transverse axis wherein a height of the magnet is selected to be greater than a span of the magnet along the longitudinal axis;
attaching the magnet to a first object;
providing at least one stopper configured to limit travel of the magnet to a selected sensing range along the longitudinal axis and wherein at least some portion of the magneto-resistive element experiences anti-parallel magnetization from the magnet over the entire selected sensing range;

attaching the magneto-resistive element to a second object such that the dipole axis of the magnetic dipole of the magnet is aligned orthogonal to the plane defined by the longitudinal axis and the transverse axis of the layers of the stack of the magneto-resistive element; and determining an electrical resistance of the conductive layer magneto-resistive element.

12. The method of claim 11, wherein the selected sensing range is obtained by dividing a maximum strength of a non-saturating applied magnetic field for the magneto-resistive element by a gradient of the magnetic field of the magnet along the longitudinal axis at a distance D from the magnet.

13. The method of claim 11, further comprising determining the position of the magnet along the longitudinal axis relative to the magneto-resistive element based on the electrical resistance of the magneto-resistive element.

14. The method of claim 11, wherein the magneto-resistive element is a giant-magneto-resistive element, and wherein the magnet is arranged at a distance D from the magneto-resistive element in a direction orthogonal to the longitudinal axis and the transverse axis.

15. The method of claim 11, wherein a sensor central axis of the magneto-resistive element is defined orthogonal to the plane defined by the longitudinal axis and the transverse axis at a position half of the longitudinal extension of the layers of the stack.

16. The method of claim 11, further comprising operating the magnet such that a magnetic field portion with magnetizations of opposite direction acts on the layers of the stack along their longitudinal extension over the entire selected sensing range.

17. The method of claim 11, wherein the vertical distance is selected to maximize linearity of the gradient of a magnetic field provided to the magneto-resistive element as the magnet is moved along the longitudinal axis over the entire selected sensing range.

18. The apparatus of claim 1, wherein the vertical distance is selected to maximize linearity of the gradient of a magnetic field provided to the magneto-resistive element as the magnet is moved along the longitudinal axis over the entire selected sensing range.

* * * * *